United States Patent
Kim et al.

(10) Patent No.: US 7,816,941 B2
(45) Date of Patent: *Oct. 19, 2010

(54) CIRCUIT AND METHOD FOR CONTROLLING TERMINATION IMPEDANCE

(75) Inventors: Kyung-Whan Kim, Kyoungki-do (KR); Kyung-Hoon Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 122 days.

This patent is subject to a terminal disclaimer.

(21) Appl. No.: 12/215,830

(22) Filed: Jun. 30, 2008

(65) Prior Publication Data

US 2009/0115450 A1    May 7, 2009

(30) Foreign Application Priority Data

Nov. 2, 2007   (KR) .................. 10-2007-0111350

(51) Int. Cl.
 *H03K 17/16*   (2006.01)
 *H03K 19/003*  (2006.01)
 *G11C 7/00*    (2006.01)
(52) U.S. Cl. ........................................ 326/30; 365/198
(58) Field of Classification Search ................ 326/30
See application file for complete search history.

(56) References Cited

U.S. PATENT DOCUMENTS 7,612,593 B2 * 11/2009 Kim et al. .................... 327/175
2004/0263226 A1 * 12/2004 Kim ........................... 327/158
2007/0126468 A1 *  6/2007 Kim ............................ 326/30
2009/0016124 A1 *  1/2009 Kim ........................... 365/194
2009/0175092 A1 *  7/2009 Cho ....................... 365/189.05
2009/0222673 A1 *  9/2009 Schneck et al. ............. 713/189
2009/0222973 A1 *  9/2009 Merkle et al. ................ 2/161.6
2009/0285048 A1 * 11/2009 Fujisawa ................. 365/233.1

FOREIGN PATENT DOCUMENTS

| KR | 1020050101865 A | 10/2005 |
| KR | 10-0625298 | 9/2006 |
| KR | 1020070081881 A | 8/2007 |

* cited by examiner

*Primary Examiner*—Vibol Tan
*Assistant Examiner*—Dylan White
(74) *Attorney, Agent, or Firm*—Blakely, Sokoloff, Taylor & Zafman LLP

(57) ABSTRACT

A termination impedance control circuit is capable of controlling a dynamic ODT operation in a DDR3-level semiconductor memory device. The termination impedance control circuit includes a counter unit configured to count an external clock and an internal clock to output a first code and a second code, respectively, and a dynamic controller configured to enable a dynamic termination operation by comparing the first code with the second code in response to a write command and disable the dynamic termination operation after a predetermined time, determined according to a burst length, has lapsed after the dynamic termination operation is enabled.

25 Claims, 4 Drawing Sheets

CIRCUIT AND METHOD FOR CONTROLLING TERMINATION IMPEDANCE

CROSS-REFERENCE(S) TO RELATED APPLICATIONS

The present application claims priority to Korean application number 10-2007-0111350, filed on Nov. 2, 2007, which is incorporated by reference in its entirety.

BACKGROUND OF THE INVENTION

The present invention relates to a termination impedance control circuit and a control method thereof, and more particularly to an on-die termination (ODT) control circuit for supporting a dynamic ODT operation used for a double data rate (DDR) 3 semiconductor memory device.

As the capacity/speed of a semiconductor memory device is gradually required to be increased, a DDR SDRAM (Synchronous Dynamic Random Access Memory) is developed and various new concepts are proposed to increase the data transmission speed of the semiconductor memory device. Among other things, termination resistance, i.e., impedance matching, is a very important factor to facilitate signal transmission between devices.

If impedance matching between the devices transmitting signals to each other is not properly achieved, a transmission signal may be reflected, thereby causing an error in signal transmission. However, when fixed resistance is applied to the termination of the devices to match the impedance, the impedance matching may not be properly achieved due to various factors, such as aging of integrated circuits, temperature variation, and manufacturing processes. To solve this problem, recently, there has been suggested a technology for controlling the termination resistance by adjusting the number of turn-on transistors, which are connected in parallel to each other, such that the resistance value can match with the external reference resistance value.

One of the apparatuses provided for this concept is an ODT control circuit. A conventional ODT control circuit is disclosed in Korean Patent Registration No. 10-0625298 in the title of "Circuit for controlling enable/disable operation of termination apparatus".

If the semiconductor memory device has a level of the DDR3 SDRAM, the dynamic ODT operation must be supported in the semiconductor memory device in accordance with the specification established by JEDEC. The term "dynamic ODT operation" refers to the operation for controlling a termination resistor provided in a chip such that the termination resistor has a termination resistance value suitable for data input when a write command is input, without reestablishing a mode register set, etc.

The termination scheme and the resistance value of an interface of a semiconductor memory device may vary according to data input and data output. In the case of data output, pull-up or pull-down termination is performed relative to an input/output pad (DQ pad) to output "high" or "low" data. In the case of data input, the input/output pad (DQ pad) are pull-up or pull-down terminated with a predetermined resistance value (which is different from a resistance value upon data output) to receive data. In the case of the DDR3-level semiconductor memory device supported with the dynamic ODT operation, the ODT operation may be stably performed according to data input, i.e., even if only a write command is input into the semiconductor memory device.

A conventional ODT control circuit simply controls the enable or disable operation of an ODT circuit. However, since the dynamic ODT operation must be additionally supported to the DDR3-level semiconductor memory device, the ODT control circuit must control the start and end modes of the dynamic ODT operation of the ODT circuit according to data input/output.

SUMMARY OF THE INVENTION

Embodiments of the present invention are directed to providing an ODT control circuit and a control method thereof, capable of controlling a dynamic ODT operation in a DDR3-level semiconductor memory device.

In accordance with an aspect of the present invention, there is provided a termination impedance control circuit, which includes a counter unit configured to count an external clock and an internal clock to output a first code and a second code, respectively, and a dynamic controller configured to enable a dynamic termination operation by comparing the first code with the second code in response to a write command and disable the dynamic termination operation after a predetermined time, determined according to a burst length, has lapsed after the dynamic termination operation is enabled.

In accordance with an aspect of the present invention, there is provided an on-die termination control circuit, which includes a counter unit configured to count an external clock and an internal clock to output a first code and a second code, respectively, a storage unit configured to store the first code in response to a write command, a dynamic enable unit configured to output a signal for enabling a dynamic termination operation by comparing a stored first code in the storage unit with the second code, an adding unit configured to output a resultant value by adding a predetermined value, which is determined according to a burst length, to the stored first code, and a dynamic disable unit configured to output a signal for disabling the dynamic termination operation by comparing the resultant value with the second code.

In accordance with an aspect of the present invention, there is provided a method for controlling on-die termination operation, the method includes generating a first and a second codes by counting external and internal clocks, respectively, enabling a dynamic termination operation by comparing the first code with the second code in response to a write command, and disabling the dynamic termination operation after a predetermined time, determined according to a burst length, has lapsed after the dynamic termination operation is enabled.

In accordance with the present invention, the termination circuit (termination apparatus) provided in the chip precisely comes into/out of the dynamic ODT operation mode as data are input/output. In addition, the time for the dynamic ODT operation is adjusted by taking a predetermined value according to the burst length into consideration, thereby easily adjusting the margin of the dynamic ODT operation. The present invention is applicable for various products performing the ODT operation.

DETAILED DESCRIPTION OF THE PREFERRED EMBODIMENTS

Hereinafter, a semiconductor memory device in accordance with the present invention will be described in detail with reference to the accompanying drawings.

Figure 1:
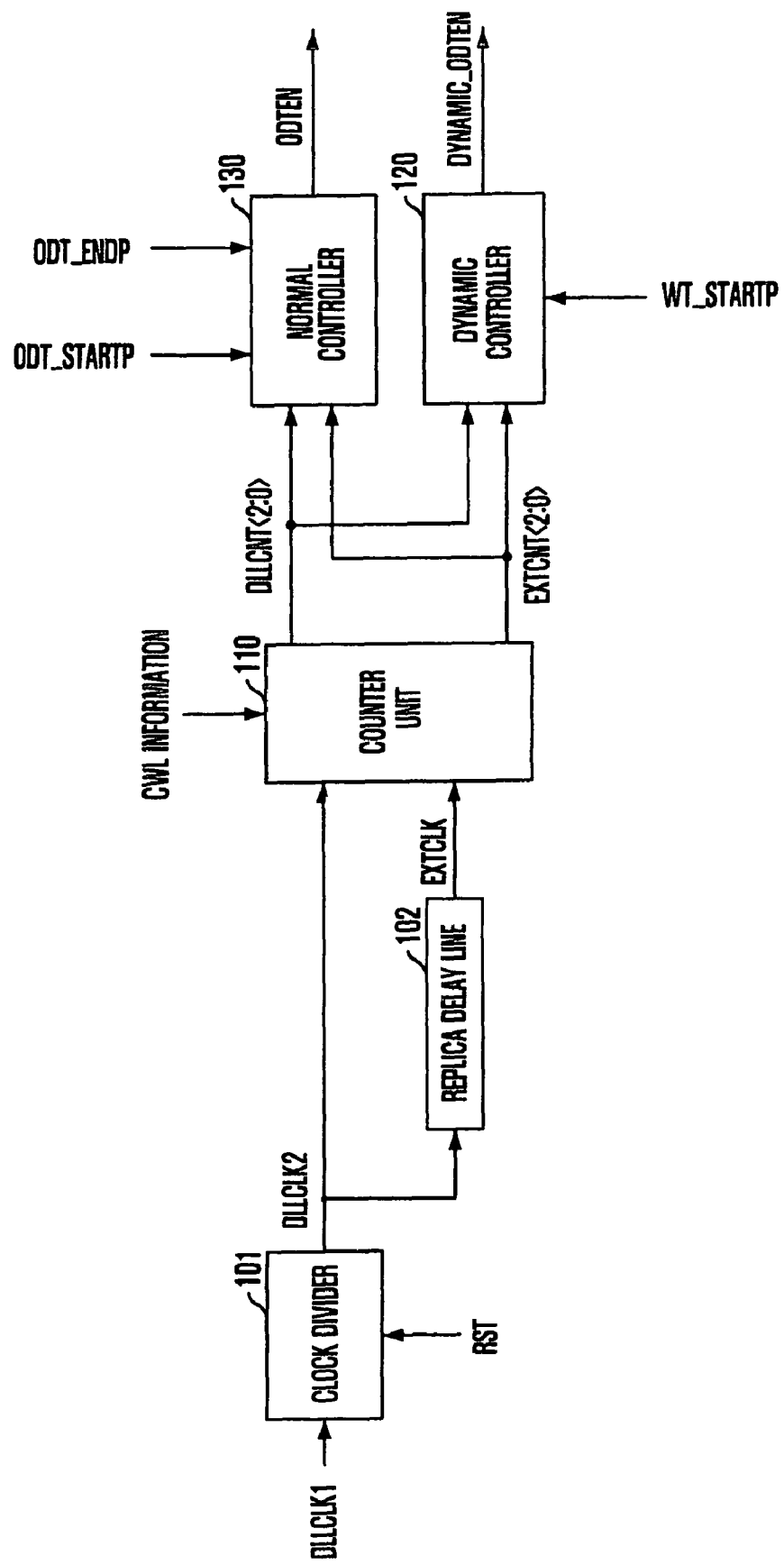
FIG. 1 is a block diagram illustrating an ODT control circuit in accordance with an embodiment of the present invention.

FIG. 1 is a block diagram illustrating an ODT control circuit in accordance with an embodiment of the present invention.

As shown in FIG. 1, the ODT control circuit of the present invention includes a counter unit 110 and a dynamic controller 120 to control a dynamic operation of an ODT circuit. The counter unit 110 counts an external clock EXTCLK to output a first code EXTCNT<2:0> and counts an internal clock DLLCLK2 to output a second code DLLCNT<2:0>. The dynamic controller 120 enables a dynamic termination operation by comparing the first code EXTCNT<2:0> with the second code DLLCNT<2:0> in response to a write command signal WT_STARTP and disables the dynamic termination operation after a predetermined clock, which is determined according to a BL (burst length), has lapsed from the enable time of the dynamic termination operation.

The ODT control circuit further includes a normal controller 130 for controlling a normal operation, other than the dynamic operation of the ODT circuit. A clock divider 101 and a replica delay line 102 are provided to supply the ODT control circuit with the internal clock DLLCLK2 and the external clock EXTCLK.

The clock divider 101 receives a delay locked internal clock DLLCLK1 through a delay locked loop (DLL) and outputs the internal clock DLLCLK2 toggled when the reset signal RST is released. The clock divider 101 prevents the internal clock DLLCLK2 from toggling until a reset signal RST is released. That is, the delay locked internal clock DLLCLK1 is different from the internal clock DLLCLK2 in that the internal clock DLLCLK2 maintains a predetermined level without being toggled until the reset signal is released.

The replica delay line 102 is a block representing time difference between the internal clock DLLCLK2 and the external clock EXTCLK. The replica delay line 102 outputs the external clock EXTCLK based on the time difference in response to the internal clock DLLCLK2.

The counter unit 110 counts the external clock EXTCLK to output the first code EXTCNT<2:0> and counts the internal clock DLLCLK2 to output the second code DLLCNT<2:0>. The first code EXTCNT<2:0> has an initial value "0", but the second code DLLCNT<2:0> has a specific initial value that is determined according to a CAS (Column Address Strobe) Write Latency (CWL). The CWL has standard values which are set according to the operational frequency. Thus, the expression "initial value is determined according to the CWL" means that "initial value is determined according to the operational frequency".

The dynamic controller 120 stores the first code EXTCNT<2:0> in response to the write command signal WT_STARTP (which is generated based on a write command and details thereof will be described later) at a specific time point. In addition, the dynamic controller 120 compares the first code EXTCNT<2:0> (a value of which is not changed because it is stored in the dynamic controller 120) with the second code DLLCNT<2:0> (a value of which is increased because it is being continuously counted) and enables the dynamic termination operation when the value of the first code EXTCNT<2:0> is identical to the value of the second code DLLCNT<2:0>. In addition, the dynamic controller 120 adds a predetermined value, which is determined according to the BL, to the first code EXTCNT<2:0> and disables the dynamic termination operation when the resultant value of the first code (which is not changed because it is obtained by adding the predetermined value to the stored first code) is identical to the value of the second code DLLCNT<2:0>. The dynamic controller 120 is very important in the present invention and details thereof will be described later with reference to the accompanying drawings.

The normal controller 130 controls the normal termination operation in response to command signals ODT_STARTP and ODT_ENDP, which are generated based on external commands input from an external memory controller.

Figure 2:
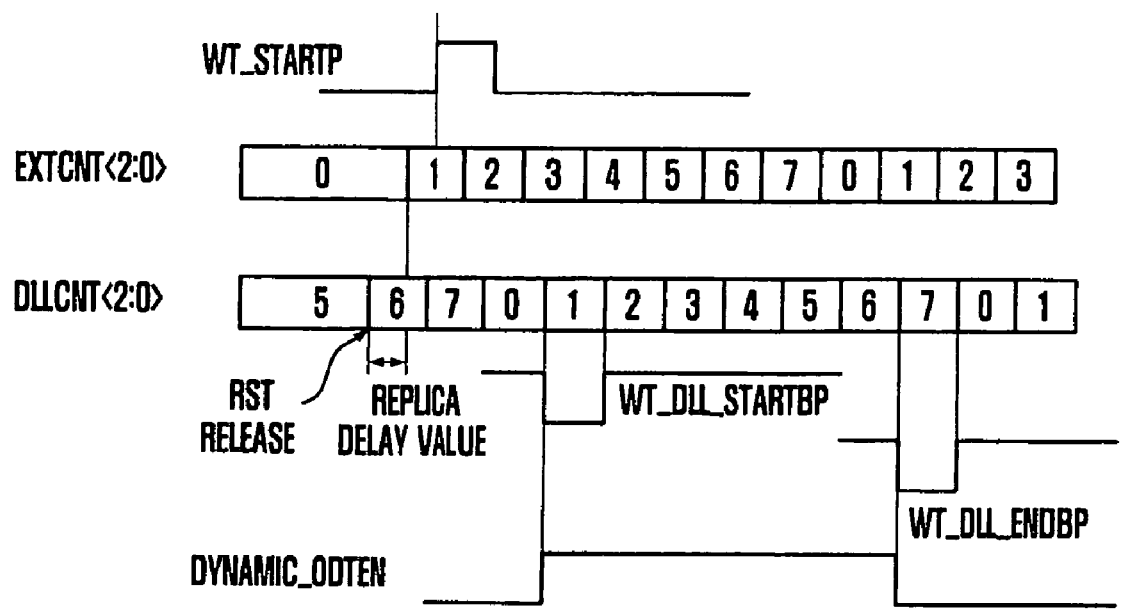
FIG. 2 is a signal timing diagram illustrating an operation of a dynamic controller described in FIG. 1.

FIG. 2 is a signal timing diagram illustrating an operation of the dynamic controller 120 described in FIG. 1.

Since the internal clock DLLCLK2 and the external clock EXTCLK are not toggled before the reset signal RST is released, the values of the first code EXTCNT<2:0> and the second code DLLCNT<2:0> are fixed to the initial value thereof without being counted. Referring to FIG. 2, the first code EXTCNT<2:0> has the initial value of "0", and the second code DLLCNT<2:0> has the initial value of "5". As described above, the initial value of the second code is determined according to the CWL. If the reset signal RST is released, the first code EXTCNT<2:0> and the second code DLLCNT<2:0> are counted. At this time, since the external clock EXTCLK is generated by delaying the internal clock DLLCLK, the first code EXTCNT<2:0> starts to be counted later than the second code DLLCNT<2:0>.

In this state, if the write command is input from the exterior, a write command signal WT_STARTP is enabled in response to the write command. At this time, the value of the first code EXTCNT<2:0> is stored (in the case of FIG. 2, 1 is stored). In addition, if the value of the second code DLLCNT<2:0> becomes identical to the value of the stored first code EXTCNT<2:0>, a WT_DLL_STARTBP signal is enabled into "low". The WT_DLL_STARTBP signal enables a DYNAMIC_ODTEN signal, which is used for controlling the dynamic termination operation, so that the dynamic termination operation starts.

Hereinafter, description will be made in relation to the end of the dynamic termination operation. A predetermined value, which is determined according to the BL, is added to the value "1" of the first code EXTCNT<2:0> that is stored in response to the write command. If the BL is 8, 8 data are input in response to the rising/falling edges of the clock, so four clocks are necessary to receive the data. According to the specification, six clocks are provided by taking the timing margin into consideration. In addition, if the BL is 4, four clocks are provided, in which two clocks are used to receive data and remaining two clocks are provided by taking the timing margin into consideration.

Therefore, if the BL is 8, the value "6" is added to the value "1" of the stored first code EXTCNT<2:0> (FIG. 2 illustrates BL=8, so the value of the first code EXTCNT<2:0> becomes 1+6=7). If the BL is 4, the value "4" is added to the value "1" of the stored first code EXTCNT<2:0> (that is, the added value is (BL/2)+2). In addition, the resultant value "7" of the first code EXTCNT<2:0> is compared with the value of the second code DLLCNT<2:0>. If the value of the second code DLLCNT<2:0> becomes identical to the value "7" of the first code EXTCNT<2:0>, a WT_DLL_ENDBP signal is enabled into "low", thereby disabling the DYNAMIC_ODTEN signal. That is, the dynamic termination operation ends.

In this manner, the dynamic controller 120 according to the present invention enables the dynamic termination operation after a predetermined time has lapsed from the input of the write command, and disables the dynamic termination operation after ensuring a predetermined margin and a data input time.

Figure 3:
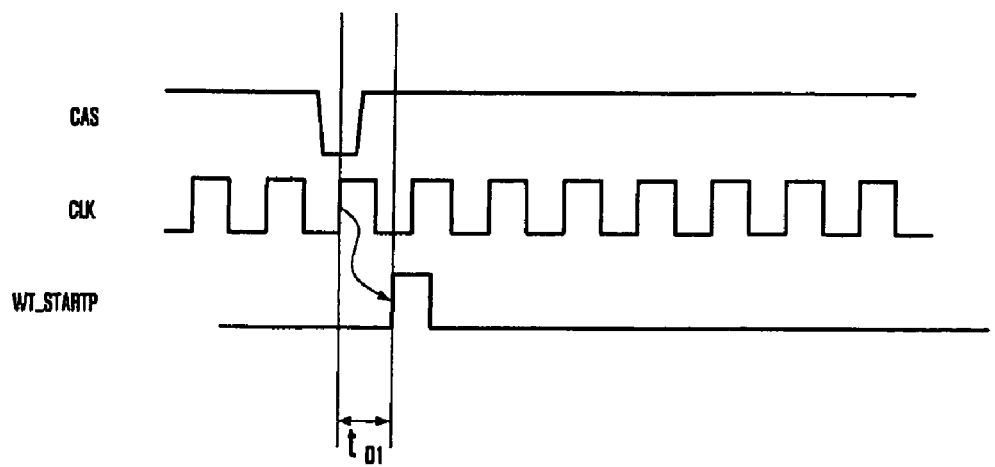
FIG. 3 is a signal timing diagram of generating a WT_STARTP described in FIG. 2.

FIG. 3 is a signal timing diagram of generating the write command signal WT_STARTP described in FIG. 2.

Basically, the write command signal WT_STARTP is enabled in response to the write command. As shown in FIG. 3, an external CAS command corresponding to the write command is input and then the write command signal WT_STARTP is enabled after a predetermined time has lapsed by taking AL (addictive latency) into consideration.

In detail, if the external CAS command corresponding to the write command is input, a command input buffer receives the external CAS command by synchronizing the external CAS command with the clock CLK. Then, after the inputted CAS command is delayed through an internal circuit, the write command signal WT_STARTP is enabled in response to the delayed CAS command. That is, the write command signal WT_STARTP is enabled after the external CAS command, which is input into the command input buffer, is delayed by a predetermined time. For reference, a pulse width of the write command signal WT_STARTP can be set according to the margin, etc.

Figure 4:
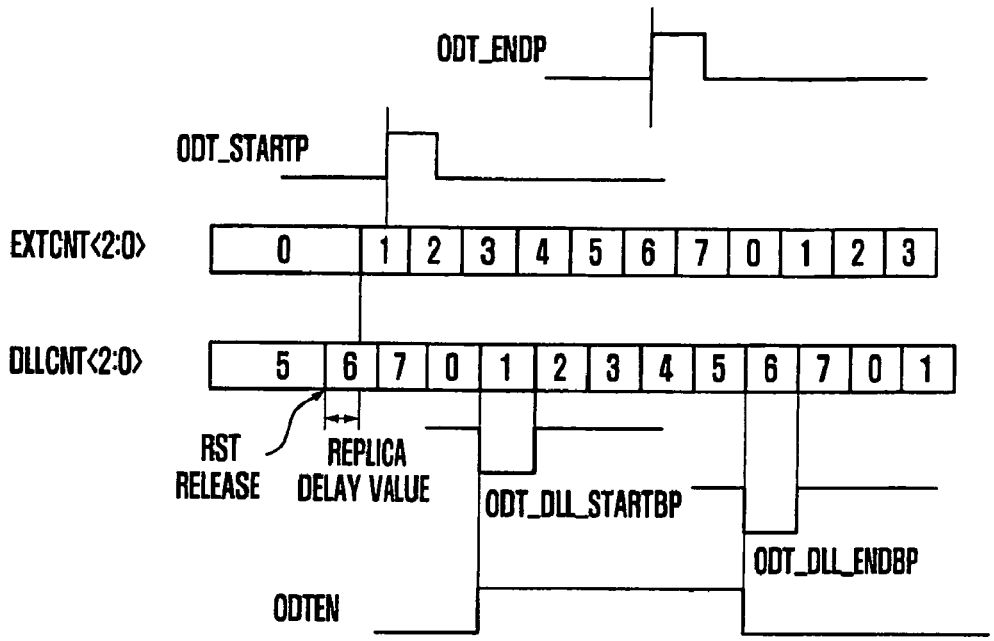
FIG. 4 is a signal timing diagram for illustrating an operation of a normal controller described in FIG. 1.

FIG. 4 is a signal timing diagram for illustrating an operation of the normal controller 130 described in FIG. 1.

Since the internal clock DLLCLK2 and the external clock EXTCLK are not toggled before the reset signal RST is released, the values of the first code EXTCNT<2:0> and the second code DLLCNT<2:0> are fixed to the initial value thereof without being counted. Referring to FIG. 4, the first code EXTCNT<2:0> has the initial value of "0", and the second code DLLCNT<2:0> has the initial value of "5". As described above, the initial value of the second code is determined according to the CWL. If the reset signal RST is released, the first code EXTCNT<2:0> and the second code DLLCNT<2:0> are counted. At this time, since the external clock EXTCLK is generated by delaying the internal clock DLLCLK, the first code EXTCNT<2:0> starts to be counted later than the second code DLLCNT<2:0>.

In this state, an ODT_STARTP signal, which is generated in response to a command from an external memory controller, is enabled. At this time, the first code EXTCNT<2:0> is stored (in the case of FIG. 4, 1 is stored). In addition, if the value of the second code DLLCNT<2:0> becomes identical to the value of the stored first code EXTCNT<2:0>, an ODT_DLL_STARTBP signal is enabled into "low". The ODT_DLL_STARTBP signal enables an ODTEN signal used for controlling the normal termination operation, which means the conventional termination operation other than the dynamic termination operation, so that the normal termination operation starts.

The procedure for ending the normal termination operation is similar to the procedure for starting the normal termination operation. That is, an ODT_ENDP signal, which is generated in response to a command from the external memory controller, is enabled. At this time, the value of the first code EXTCNT<2:0> is stored (in the case of FIG. 4, 6 is stored). In addition, if the value of the second code DLLCNT<2:0> becomes identical to the value of the stored first code EXTCNT<2:0>, an ODT_DLL_ENDBP signal is enabled into "low". The ODT_DLL_ENDBP signal disables the ODTEN signal used for controlling the normal termination operation, so that the normal termination operation ends.

That is, the start and end of the normal termination operation are basically controlled by means of the external memory controller.

Figure 5:
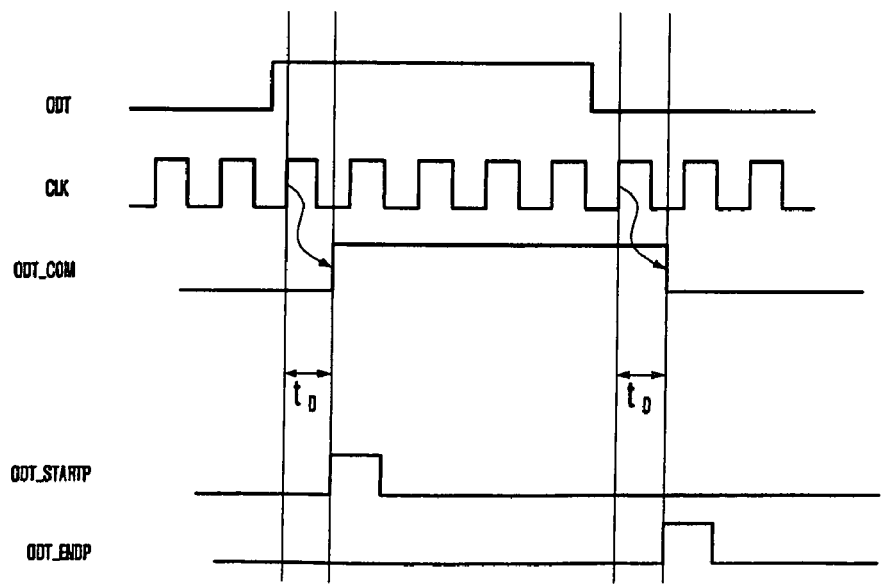
FIG. 5 is a signal timing diagram of generating an ODT_STARTP signal and an ODT_ENDP signal described in FIG. 4.

FIG. 5 is a signal timing diagram of generating the ODT_STARTP signal and the ODT_ENDP signal described in FIG. 4.

In general, the ODT_STARTP signal and the ODT_ENDP signal are generated by an external command ODT, which is, relative to an ODT operation, input from the external memory controller called a chipset. The external command ODT is input from the external memory controller by taking the setup hold condition and the like into consideration. The external command ODT is input in synchronization with an internal clock and delayed for a predetermined time by taking the addictive latency into consideration to generate an ODT_COM signal. In addition, when the ODT_COM signal is enabled and disabled, the ODT_STARTP signal and the ODT_ENDP signal, which are pulse signals, are enabled, respectively.

Figure 6:
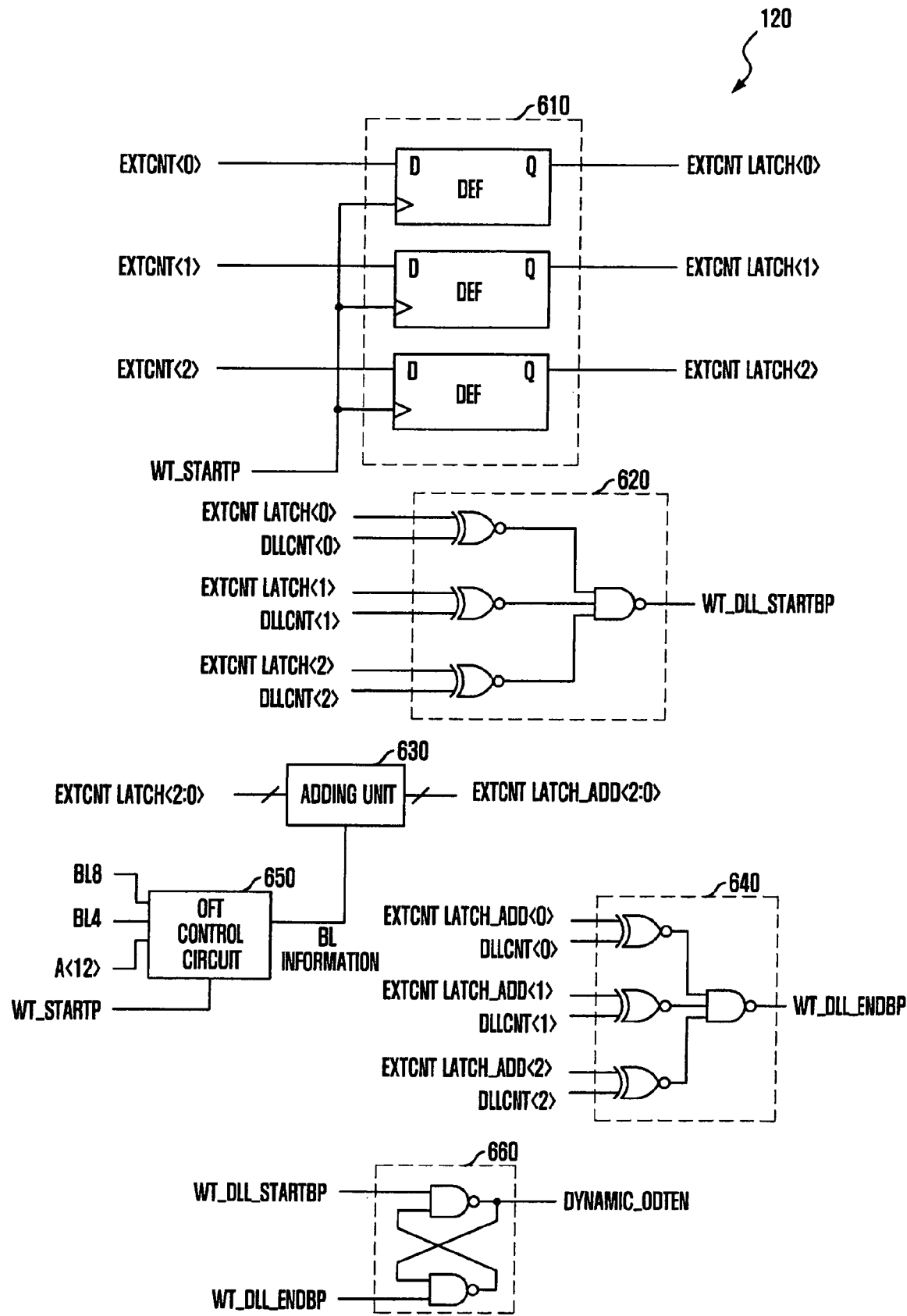
FIG. 6 is a schematic circuit diagram illustrating the dynamic controller of FIG. 1.

FIG. 6 is a schematic circuit diagram illustrating the dynamic controller 120 of FIG. 1, which is operated as shown in FIG. 2.

Referring to FIG. 6, the dynamic controller 120 includes a storage unit 610, a dynamic enable unit 620, an adding unit 630, and a dynamic disable unit 640. The storage unit 610 stores the first code EXTCNT<2:0> in response to a write command signal WT_STARTP which is generated according to a write command. The dynamic enable unit 620 outputs the signal WT_DLL_STARTBP for enabling the dynamic termination operation by comparing the stored first code EXTCNTLATCH<2:0> in the storage unit 610 with the second code DLLCNT<2:0>. The adding unit 630 outputs a resultant value EXTCHTLATCH_AD<2:0> by adding a predetermined value, which is determined according to the BL, to a value of the stored first code EXTCNTLATCH<2:0> in the storage unit 610. The dynamic disable unit 640 outputs the signal WT_DLL_ENDBP for disabling the dynamic termination operation by comparing the resultant value EXTCHTLATCH_AD<2:0> output from the adding unit 630 with the second code DLLCNT<2:0>.

In addition, the dynamic controller 120 may further include an OFT (on-the-fly) control circuit 650 that provides BL information to the adding unit 630, and an SR latch 660 that generates a level signal DYNAMIC_ODTEN for enabling or disabling the dynamic termination operation, which is enabled when the level signal is high and disabled when the level signal is low, by combining output signals WT_DLL_STARTBP and WT_DLL_ENDBP (pulse signals) of the dynamic enable unit 620 and the dynamic disable unit 640.

The storage unit 610 includes flip-flops. The flip-flops store the first code EXTCNT<2:0> in synchronization with the write command signal WT_STARTP, which is enabled after a predetermined time has lapsed from the write command The dynamic enable unit 620 includes exclusive NOR gates and a NAND gate. The exclusive NOR gates compare the stored first code EXTCNTLATCH<2:0> in the storage unit 610 with the second code DLLCNT<2:0>. The NAND gate performs a logic operation relative to output values of the exclusive NOR gates.

The adding unit 630 includes a full adder which adds a value of "(BL/2)+2" to the stored first code EXTCNTLATCH<2:0> in the storage unit 610.

The dynamic disable unit 640 includes exclusive NOR gates and a NAND gate. The exclusive NOR gates compare the output value EXTCNTLATCH_ADD<2:0> of the adding unit 630 with the second code DLLCNT<2:0>. The NAND gate performs a logic operation relative to output values of the exclusive NOR gates.

The OTF control circuit 650 is provided to support the OTF operation mode. In a DDR3 memory device, the BL can be set to BL=4, BL=8, and OTF by an MRS. If the BL is set to OTF, the BL is not preset to 4 or 8, but is determined as 4 or 8 according to a value of the address number 12 (1 or 0) when the read or write command is input. That is, the OTF is one of schemes for setting the BL. The write command signal WT_STARTP is input into the OTF control circuit 650 in such a manner that the write command signal WT_STARTP can be used as a trigger signal, because the OTF control circuit 650 is used when the dynamic termination mode is employed.

Regardless of the value of the BL, which is directly set by the MRS or determined according to the OTF mode, the OTF control circuit functions to provide the adding unit with the BL information.

The SR latch 660 outputs a dynamic termination level signal DYNAMIC_ODTEN which is set according to the output signal WT_DLL_STARTBP of the dynamic enable unit 620 and is reset according to the output signal WT_DLL_ENDBP of the dynamic disable unit 640.

The dynamic controller 120 has a structure as shown in FIG. 6 and the operation thereof is shown in FIG. 2 in detail, so the operation of the dynamic controller 120 will not be further described below.

The normal controller 130 enables/disables the normal termination operation according to signals ODT_STARTP and ODT_ENDP, which are generated by the external controller. The enable/disable scheme of the normal controller 130 is similar to the enable scheme of the dynamic controller 120 for the dynamic termination operation. Thus, the normal controller 130 may include two pairs of circuits having configuration similar to that of the storage unit 610 and the dynamic enable unit 620. The present invention is focused on the dynamic controller 120, other than the normal controller 130, and those of ordinary skilled in the art can readily realize the normal controller 130, so the description thereof will be omitted.

Hereinafter, the method of controlling the ODT operation according to the present invention will be described with reference to FIGS. 1 to 6.

The method of controlling the ODT operation according to the present invention includes the steps of generating a first code EXTCNT<2:0> by counting an external clock EXT-CLK and generating a second code DLLCNT<2:0> by counting an internal clock DLLCLK2, enabling a dynamic termination operation by comparing the first code EXTCNT<2:0> with the second code DLLCNT<2:0> in response to a write command, that is, in response to the write command signal WT_STARTP generated by the write command, and disabling the dynamic termination operation after a predetermined time, determined according to the burst length, has lapsed after the dynamic termination operation is enabled.

In detail, the step of enabling the dynamic termination operation includes the steps of storing the first code EXTCNT<2:0> in response to the write command signal WT_STARTP, and comparing the second code DLLCNT<2:0> with the stored first code EXTCNTLATCH<2:0>.

In addition, the step of disabling the dynamic termination operation includes the steps of adding a predetermined value ((BL/2)+2), which is determined according to the burst length, to the stored first code EXTCNTLATCH<2:0>, and comparing the second code DLLCNT<2:0> with a resultant value of the first code EXTCNTLATCH_ADD<2:0>.

In this manner, the ODT control circuit according to the present invention can precisely control the start and end of the dynamic termination operation which is newly added to the DDR3-level semiconductor memory device. In addition, the present invention is applicable for various products performing the dynamic termination operation.

Although preferred embodiments of the present invention have been disclosed for illustrative purposes, those skilled in the art will appreciate that various modifications, additions and substitutions are possible, without departing from the scope and spirit of the invention as defined in the accompanying claims.

What is claimed is:

1. A termination impedance control circuit comprising:
   a counter unit configured to count an external clock and an internal clock to output a first code and a second code, respectively; and
   a dynamic controller configured to enable a dynamic termination operation by comparing the first code with the second code in response to a write command and disable the dynamic termination operation after a predetermined time has lapsed after the dynamic termination operation is enabled.

2. The termination impedance control circuit of claim 1, wherein the internal clock includes an output clock of a delay locked loop.

3. The termination impedance control circuit of claim 2, wherein the external clock is generated by delaying the internal clock through a replica delay line.

4. The termination impedance control circuit of claim 1, wherein the first and second codes are counted in response to release of a reset signal.

5. The termination impedance control circuit of claim 4, wherein an initial value of the second code is determined according to a column address strobe write latency.

6. The termination impedance control circuit of claim 1, wherein the predetermined time is determined according to a burst length.

7. The termination impedance control circuit of claim 6, wherein the dynamic controller enables the dynamic termination operation when a value of the first code, which is stored in response to the write command, becomes identical to a value of the second code, and disables the dynamic termination operation when a value of the first code, which is obtained by adding a predetermined value determined according to the burst length to said stored value, becomes identical to a value of the second code.

8. The termination impedance control circuit of claim 6, wherein the first code is stored while being synchronized with a signal which is enabled after an input of the write command.

9. The termination impedance control circuit of claim 1, wherein the predetermined time corresponds to a number of reference clocks and has a value of ((burst length/2)+2).

10. An on-die termination control circuit comprising:
    a storage unit configured to store a first code in response to a write command;
    a dynamic enable unit configured to output a signal for enabling a dynamic termination operation by comparing the stored first code in the storage unit with a second code;
    an adding unit configured to output a resultant value by adding a predetermined value, to the stored first code; and
    a dynamic disable unit configured to output a signal for disabling the dynamic termination operation by comparing the resultant value with the second code.

11. The on-die termination control circuit of claim 10, wherein the second code is generated by counting an output clock of a delay locked loop.

12. The on-die termination control circuit of claim 11, wherein the first code is generated by counting the internal clock delayed through a replica delay line.

13. The on-die termination control circuit of claim 10, wherein the first and second codes are counted in response to release of a reset signal.

14. The on-die termination control circuit of claim 10, wherein an initial value of the second code is determined according to a column address strobe write latency.

15. The on-die termination control circuit of claim 10, wherein the storage unit includes flip-flops that store the first code while being synchronized with a signal which is enabled after an input of the write command.

16. The on-die termination control circuit of claim 10, wherein the dynamic enable unit includes:
  exclusive NOR gates for comparing the stored first code with the second code; and
  a NAND gate for performing a logic operation on output values of the exclusive NOR gates.

17. The on-die termination control circuit of claim 10, wherein the adding unit includes a full adder which adds a value of ((burst length/2)+2) to the stored first code.

18. The on-die termination control circuit of claim 10, wherein the dynamic disable unit includes:
  exclusive NOR gates for comparing the resultant value with the second code; and
  a NAND gate for performing a logic operation on output values of the exclusive NOR gates.

19. The on-die termination control circuit of claim 10, further comprising an SR latch configured to be set according to an output signal of the dynamic enable unit and be reset according to an output signal of the dynamic disable unit.

20. The on-die termination control circuit of claim 10, further comprising a normal controller configured to control a normal termination operation to be performed in response to a command input from an external memory controller.

21. The on-die termination control circuit of claim 10 wherein the predetermined time is determined according to a burst length.

22. A method for controlling on-die termination operation, the method comprising:
  generating first and second codes by counting external and internal clocks, respectively;
  enabling a dynamic termination operation by comparing the first code with the second code in response to a write command; and
  disabling the dynamic termination operation after a predetermined time, has lapsed after the dynamic termination operation is enabled.

23. The method of claim 22, wherein enabling the dynamic termination operation includes:
  storing the first code in response to the write command; and
  comparing the second code with the stored first code.

24. The method of claim 22 wherein the predetermined time is determined according to a burst length.

25. The method of claim 24, wherein disabling the dynamic termination operation includes:
  adding a predetermined value, which is determined according to the burst length, to the stored first code; and
  comparing the second code with the added first code.

* * * * *